United States Patent
Hu

(10) Patent No.: US 7,158,357 B2
(45) Date of Patent: Jan. 2, 2007

(54) CAPACITOR DESIGN IN ESD CIRCUITS FOR ELIMINATING CURRENT LEAKAGE

(75) Inventor: Chang-fen Hu, Pan-Chao (CN)

(73) Assignee: Taiwan Semiconductor Manufacturing Xo., Ltd., Hsin-Chu (TW)

( * ) Notice: Subject to any disclaimer, the term of this patent is extended or adjusted under 35 U.S.C. 154(b) by 220 days.

(21) Appl. No.: 10/816,745

(22) Filed: Apr. 2, 2004

(65) Prior Publication Data

US 2005/0225911 A1 Oct. 13, 2005

(51) Int. Cl.
*H02H 9/00* (2006.01)

(52) U.S. Cl. ...................................... 361/56
(58) Field of Classification Search .................. 361/56
See application file for complete search history.

(56) References Cited

U.S. PATENT DOCUMENTS

| | | | | |
|---|---|---|---|---|
| 4,144,634 A * | 3/1979 | Chang et al. | | 438/590 |
| 5,452,171 A * | 9/1995 | Metz et al. | | 361/56 |
| 5,565,790 A * | 10/1996 | Lee | | 326/30 |
| 6,310,379 B1 * | 10/2001 | Andresen et al. | | 257/355 |
| 6,343,045 B1 * | 1/2002 | Shau | | 365/227 |
| 6,392,860 B1 * | 5/2002 | Lin et al. | | 361/111 |
| 6,812,050 B1 * | 11/2004 | Ramappa | | 438/17 |
| 2002/0130390 A1 | 9/2002 | Ker et al. | | 257/546 |
| 2002/0153570 A1 * | 10/2002 | Lin et al. | | 257/355 |
| 2003/0223166 A1 * | 12/2003 | Chen et al. | | 361/56 |

* cited by examiner

*Primary Examiner*—Stephen W. Jackson
*Assistant Examiner*—Ann T. Hoang
(74) *Attorney, Agent, or Firm*—Duane Morris, LLP

(57) ABSTRACT

An electrostatic discharge (ESD) protection circuit for an integrated circuit (IC) is disclosed. The ESD protection circuit has a RC module having a resistor and capacitor connected in series; and a current dissipation module for dissipating the ESD, wherein the capacitor is formed by a thick native gate oxide of a transistor, and wherein the thick native gate oxide prevents leakage current formed therethrough so that to avoid leakage current through the current dissipation module during a normal operation of the IC.

15 Claims, 4 Drawing Sheets

|  | Unit Capacitance | Leakage |
|---|---|---|
| Thin oxide device | Best | Unacceptable |
| Thick oxide device | Poor | Best |
| Native thick oxide device | Good | Best |

FIG. 2

CAPACITOR DESIGN IN ESD CIRCUITS FOR ELIMINATING CURRENT LEAKAGE

BACKGROUND

The present disclosure relates generally to integrated circuit design, and more particularly, to a structure for a capacitor component in a circuit for protecting the core circuitry of an integrated circuit from damage that may be caused by electrostatic discharge (ESD).

A gate oxide of any metal-oxide-semiconductor (MOS) transistor, in an integrated circuit, is most susceptible to damage. The gate oxide may be destroyed by being contacted with a voltage only a few volts higher than the supply voltage. It is understood that a regular voltage is 5.0, 3.3, 3.1 volts, or even lower. Electrostatic voltages from common environmental sources can easily reach thousands, or even tens of thousands of volts. Such voltages are destructive even though the charge and any resulting current are extremely small. So, it is of critical importance to discharge any static electric charge, as it builds up, before it accumulates to a damaging voltage.

ESD is only a concern to an IC before it is installed into a larger circuit assembly, such as a printed circuit board (PCB), and before the PCB is connected to operating power. This susceptible period includes production, storage, transport, handling, and installation. After the power is supplied, the power supplies and the structures can easily absorb or dissipate electrostatic charges.

ESD protective circuitry is typically added to ICs at the bond pads. The pads are the connections to the IC, to outside circuitry, for all electric power supplies, electric grounds, and electronic signals. Such added circuitry must allow normal operation of the IC. That means that the protective circuitry is effectively isolated from the normally operating core circuitry and it blocks current flow through itself to ground, or any other circuit or pad. In an operating IC, electric power is supplied to a VCC pad, electric ground is supplied to a VSS pad, electronic signals are supplied from outside to some pads, and electronic signals generated by the core circuitry of the IC are supplied to other pads for delivery to external circuits and devices. In an isolated, unconnected IC, all pads are considered to be electrically floating, or of indeterminant voltage. In most cases, that means that the pads are at ground, or zero, voltage.

ESD can arrive at any pad. This can happen, for example, when a person touches some of the pads on the IC. This is the same static electricity that may be painfully experienced by a person who walks across a carpet on a dry day and then touches a grounded metal object. In an isolated IC, ESD acts as a brief power supply for one or more pads, while the other pads remain floating, or grounded. Because the other pads are grounded, when ESD acts as a power supply at a randomly selected pad, the protection circuitry acts differently then it does when the IC is operating normally. When an ESD event occurs, the protection circuitry must quickly become conductive so that the electrostatic charge is conducted to VSS or ground, and is, thusly, dissipated before damaging voltage builds up.

ESD protection circuitry, therefore, has two states. In a normally operating IC, ESD protection circuitry appears invisible to the IC by blocking current through itself and, thusly, having no effect on the IC. In an isolated, unconnected IC, ESD protection circuitry serves its purpose of protecting the IC by conducting an electrostatic charge quickly to VSS or ground before a damaging voltage can build up.

In a typical ESD protection circuit such as a capacitor-couple type or a gate driven type, an RC circuit module comprised of a resistor and a capacitor (RC), controls an inverter or a gate of a transistor, which further switches a large N-channel metal-oxide-semiconductor field-effect-transistor (NMOSFET) which conducts the ESD charge to ground. The capacitor needs to be large enough that, in combination with the resistor, it can provide a large RC time constant. During the beginning of the delay provided by the RC time constant, the voltage on the capacitor builds up slowly from zero to the switching threshold of the inverter. That delay, until the inverter switches, must be long enough for the dissipation of the ESD charge. The value of the capacitor and the quality of the capacitor are critical.

As feature sizes of transistors in ICs shrink to sub-micron sizes, the gate oxide thickness also becomes thinner. The same oxides are conveniently used as the dielectric in the construction of the capacitor in an ESD protection circuit. If the dielectric oxide of the capacitor is too thin, then the oxide is electrically leaky, then the current will also be conducted by the resistor, and the voltage on the capacitor will rise toward the threshold voltage. The risen voltage can potentially cause the large NMOSFET to have a large leakage current flowing from VCC and VSS. In such a case, too much power would be consumed and the circuit is not acceptable.

If a thick oxide is used for the capacitor, since the capacitance per unit area is much smaller than a thin oxide capacitor, a larger area is needed for obtaining the same capacitance. Further, the normal thick oxide capacitors have a non-linear capacitance performance.

What is needed is an oxide to be used as the dielectric in the capacitor that provides reasonably large capacitance per unit area and does not allow electrical leakage.

SUMMARY

In view of the foregoing, this disclosure provides an electrostatic discharge (ESD) protection circuit for an integrated circuit (IC) are disclosed. The ESD protection circuit has a RC module having a resistor and capacitor connected in series; and a current dissipation module for dissipating the ESD, wherein the capacitor is formed by a thick native gate oxide of a transistor, and wherein the thick native gate oxide prevents leakage current formed therethrough so that to avoid leakage current through the current dissipation module during a normal operation of the IC.

Various aspects and advantages will become apparent from the following detailed description, taken in conjunction with the accompanying drawings, illustrating the principles of the disclosure by way of examples.

BRIEF DESCRIPTION OF THE DRAWINGS

FIG. 2 lists oxide characteristics in accordance with one example of the present disclosure.

DESCRIPTION

The present disclosure provides an improved method for electrostatic discharge (ESD) protection for an integrated circuit (IC). The improved design provides a high-quality, high-efficiency capacitor component without the requirement of using an extra mask layer. As will be shown in more detail below, the improved capacitor structure uses a thick native oxide as a dielectric material between the two plates of a capacitor. This native oxide material has lower inherent electrical leakage than a thin, thermally grown oxide, and also has a greater capacitance per unit area than thick thermally grown oxide.

Figure 1:
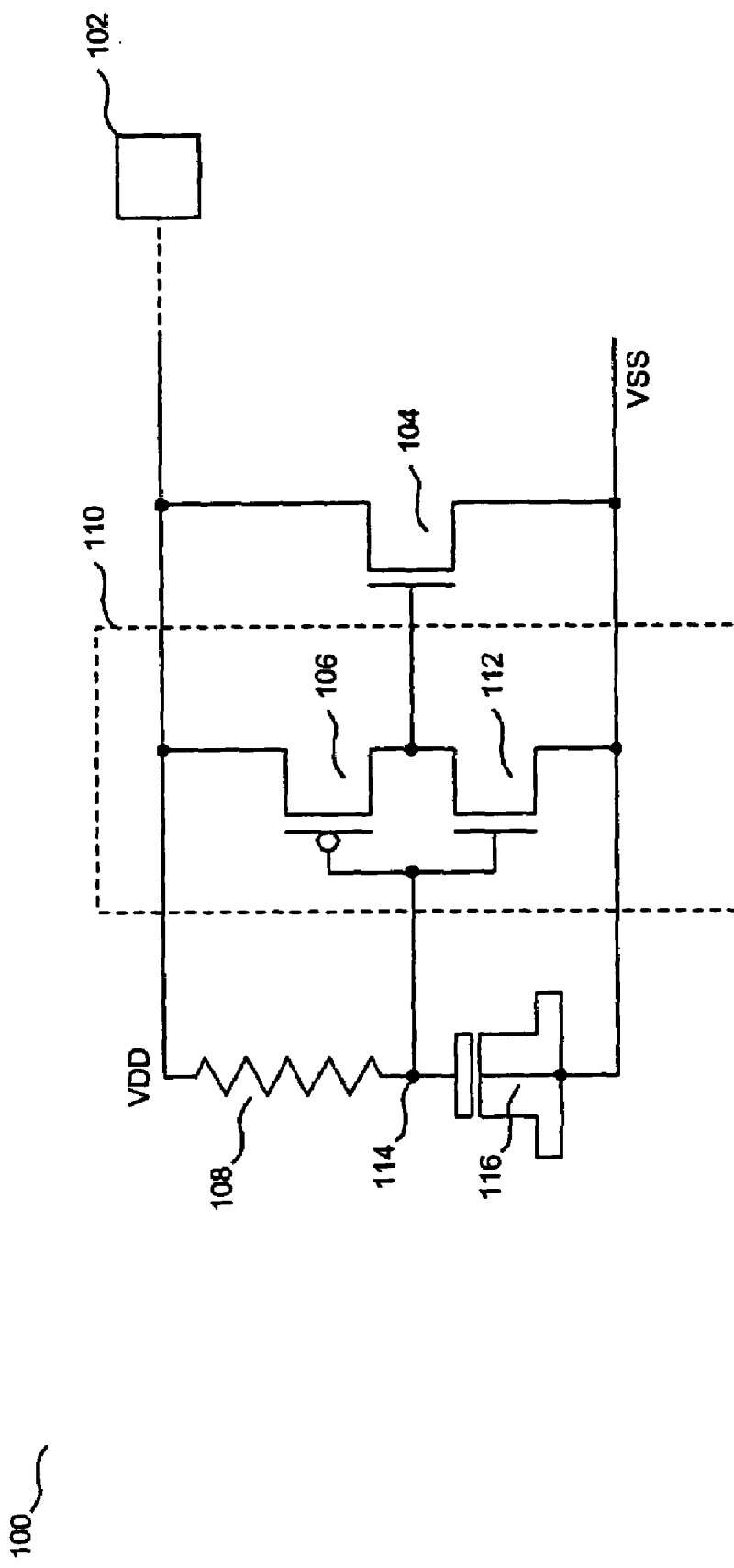
FIG. 1 is a circuit diagram of an ESD protection circuit for an IC including a NMOSFET capacitor in accordance with one example of the present disclosure.

FIG. 1 illustrates a typical ESD protective circuit 100 for an IC. A pad (bond pad) 102 is connected to the drain of a large N-channel metal-oxide-semiconductor field-effect-transistor (NMOSFET) 104, to the source of a P-channel metal-oxide-semiconductor field-effect-transistor (PMOSFET) 106, and to a resistor 108. The source of NMOSFET 104 is connected to VSS. The gate of NMOSFET 104 is connected to the output of inverter 110, which is the drain of PMOSFET 106 and the drain of NMOSFET 112. The source of NMOSFET 112 is connected to VSS. Together, PMOSFET 106 and NMOSFET 112 form inverter 110. The gates of PMOSFET 106 and NMOSFET 112 of inverter 110 are connected to node 114. Node 114 is also connected between resistor 108 and the gate of NMOSFET capacitor 116. The body, or lower electrode, of NMOSFET capacitor 116 is connected to VSS.

Before an IC is connected into a larger electronic assembly, it is vulnerable to damage from ESD. When an ESD charge arrives at pad 102, that charge acts as a temporary power supply for at least a part of the IC. The intended function of the ESD protective circuit is to dissipate the ESD charge to VSS before voltage levels build up enough to damage the core circuitry of the IC. As the ESD voltage begins to rise, it is applied to the series combination of resistor 108 and NMOSFET capacitor 116. Current begins to flow through resistor 108 into NMOSFET capacitor 116. The product of the values of those two components determines an RC time constant. To provide the intended ESD protection, the large NMOSFET 104 must remain on and conduct long enough to dissipate the ESD charge. If NMOSFET 104 turns off too soon, then some of the ESD charge will remain and excessive voltage will damage the core circuitry of the IC. The RC time constant must be long enough to hold the rising voltage on NMOSFET capacitor 116 below the threshold of the inverter 110 until the ESD charge is fully dissipated. During that time, the inverter 110 keeps a positive bias voltage on the gate of the large NMOSFET 104 to hold it on and conducting.

As such, NMOSFET capacitor 116 must be constructed such that it has sufficiently large capacitance to provide the protective function, but within a reasonably small physical space. As the internal geometries of ICs are manufactured to be smaller, the gate oxides become thinner. The currently manufactured thin, thermally grown, gate oxides are somewhat electrically leaky. This increased leakage occurs in oxides thinner than about 60 angstroms because quantum electron tunneling effect becomes significant. If the resulting NMOSFET capacitor 116 is leaky, then, in normal operation, current flows through the NMOSFET capacitor 116 and through the resistor 108. Current flowing through the resistor 108 creates a voltage at node 114, which is somewhat below VDD. A lowered bias voltage driving the inverter 110 means that an output voltage from the inverter 110 is raised. That raised output voltage will drive the large NMOSFET 104 into an unintended leakage current. Now, the series combination of resistor 108 and NMOSFET 116 is leaking, the inverter 110 is leaking, and the large NMOSFET 104 is leaking. As this occurs at every ESD protected pad, too much power is consumed and too much heat is generated during the IC's normal operation. To avoid that outcome, a better quality oxide is needed. If a traditional thick, thermally grown, gate oxide is used in the construction of NMOSFET capacitor 116, then the capacitance per unit area is significantly reduced and a physically larger NMOSFET capacitor 116 must be constructed at greater expense. A variation of this ESD circuit is to eliminate the PMOS transistor 106 so that only the NMOS transistor 112 is the control module for controlling the gate of the NMOS transistor 104 for dissipating current. Since the ESD circuits can have different alternative designs, they generally have three key modules: the RC module (e.g., resistor 108 and capacitor 116), the control module (e.g., the inverter 110) and the current dissipation module (e.g., transistor 104).

As provided by the present invention, a native oxide is grown by ambient or chemical exposure, with or without high temperatures. One of the most important reasons Si has become such a successful medium for integrated microelectronics is that it has a good native oxide, which means that Si oxidizes to form a dielectric oxide such as silicon dioxide, $SiO_2$. $SiO_2$ is a good insulating layer and can be created by exposing Si to an $O_2$ environment. At elevated temperatures (~1000° C.) the oxide grows quickly. An advantage of native thermal oxides, such as SiO2 is that they have similar material properties (e.g., thermal expansion coefficient, lattice size, etc.) of the native material. This means that oxides can be grown without creating significant stresses in the material. Thermal oxide grown in Si can be masked by photoresist (PR), and better results can be obtained if SiN is used to mask thermal oxidation. Because oxidation material ($O_2$) is being added to the wafer, the wafer grows in thickness for the gate oxide. About 50% of the oxide grows beneath the surface and the other half on top of the original surface. The detailed processes for growing native oxide in MOS fabrication are known in the industry, and the thickness of which can be well controlled.

This native oxide can be used as a gate oxide in a MOSFET. A thick native gate oxide provides an intermediate value of capacitance per unit area that is acceptable. Also, a thick native gate oxide provides an electrical current leakage rate that is much lower than that of a thin thermally grown gate oxide and approaching that of a thick thermally grown gate oxide.

FIG. 2 presents a table 200 that lists the relative capacitance and leakage performances of these three oxide options. For capacitance per unit area, thin thermal oxide is best, thick thermal oxide is poor, and native thick oxide is good. For electrical current leakage, thin thermal oxide is unacceptable, thick thermal oxide is best, and thick native oxide is also best. So the choice for NMOSFET capacitor gate oxide is thick native oxide. Furthermore, a further production advantage for thick native oxide is that it can be produced without any additional photomasks.

Figure 3:
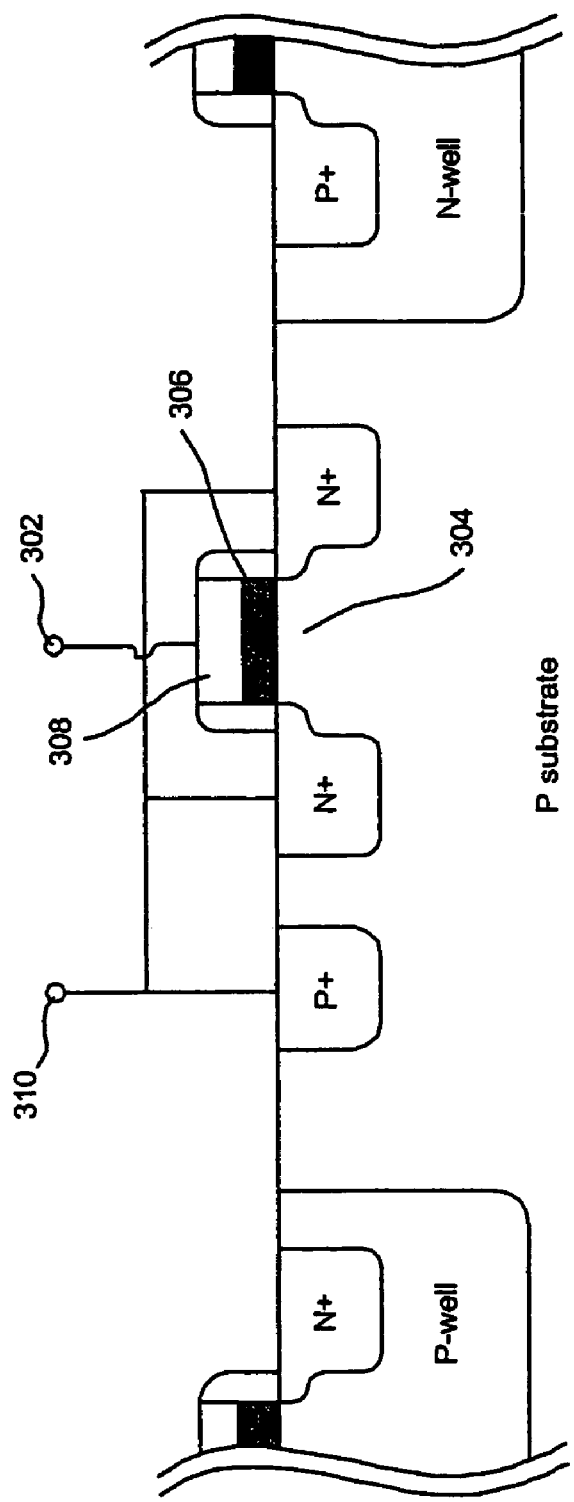
FIG. 3 illustrates a NMOSFET capacitor in accordance with one example of the present disclosure.

FIG. 3 illustrates the structure and application of a NMOSFET capacitor in a silicon chip. Applied gate voltage at node 302 controls charge inversion in the MOS channel below and adjacent to the gate oxide. The degree of inversion determines the charge density available there. That inversion layer defines a lower plate 304 of a capacitor, the oxide 306 is the dielectric of the capacitor, and the gate electrode 308 is the upper plate of a capacitor. The lower plate 304 is connected to VSS by electrode 310.

Figure 4:
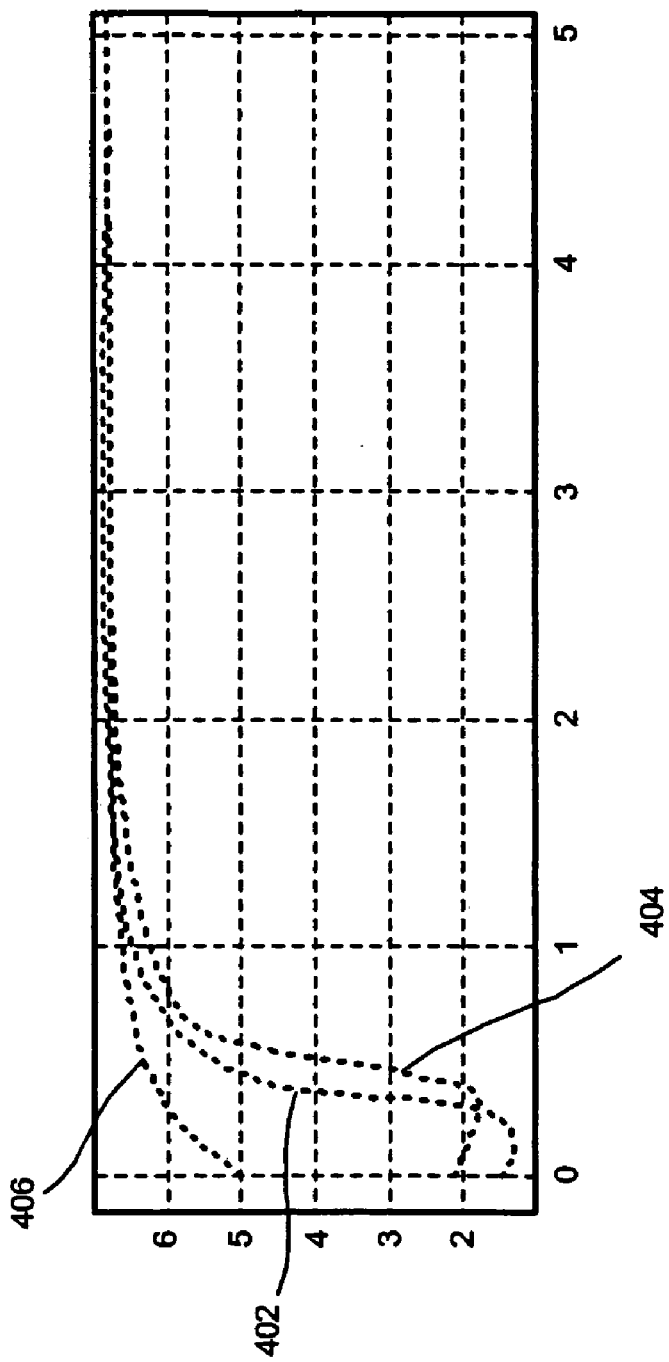
FIG. 4 illustrates the capacitance characteristics of various oxides in accordance with one example of the present disclosure.

FIG. 4 illustrates the capacitance performances of the three oxide options versus voltage. Thin thermally grown oxide 402 provides a low positive bias inversion threshold voltage. Thick thermally grown oxide 404 provides a slightly higher positive bias inversion threshold voltage. Thick native oxide 406 provides a near-zero inversion threshold voltage. The near-zero inversion threshold voltage means that nearly the maximum capacitance value is functional immediately as an ESD voltage begins to rise above zero. This is an advantage since higher capacitance over the whole voltage swing means a longer RC time constant for the entire ESD voltage rise and therefore a greater assurance of keeping the large NMOSFET conducting long enough to dissipate the entire ESD charge.

The native gate oxide thus provides a better solution for the capacitance needed for an ESD circuit. The thick native oxide capacitor device provides more linear capacitance values, insignificant leakage current, and a better capacitance efficiency per unit area.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. An electro-static discharge (ESD) protection circuit for an integrated circuit (IC) comprising:
    a RC module having a resistor and capacitor connected in series; and
    a current dissipation module for dissipating the ESD,
    wherein the capacitor is formed by a thick native gate oxide of a transistor, and
    wherein the thick native gate oxide prevents leakage current formed therethrough so that to avoid leakage current through the current dissipation module during a normal operation of the IC.

2. The ESD protection circuit of claim 1 wherein the current dissipation module is a NMOS transistor connected between a pad of the IC and a grounding line of the IC.

3. The ESD protection circuit of claim 1 further comprising a control module connected between the RC module and the current dissipation module for controlling the current dissipation module.

4. The ESD protection circuit of claim 3 wherein the control module is an inverter.

5. The ESD protection circuit of claim 3 wherein the control module is a NMOS transistor.

6. The ESD protection circuit of claim 1 wherein a thickness of a gate oxide for a regular transistor of the IC is below 60 angstroms.

7. The ESD protection circuit of claim 1 wherein a threshold voltage of the transistor forming the capacitor is close to zero.

8. An electro-static discharge (ESD) protection circuit for an integrated circuit (IC) comprising:
    a RC module having a resistor and capacitor connected in series;
    a control module coupled to the RC module; and
    a current dissipation module controlled by the control module for dissipating the ESD,
    wherein the capacitor is formed by a thick native gate oxide of a transistor having a threshold voltage close to zero, and
    wherein the thick native gate oxide prevents leakage current formed therethrough so that to avoid leakage current through the current dissipation module during a normal operation of the IC.

9. The ESD protection circuit of claim 8 wherein the current dissipation module is a NMOS transistor connected between a pad of the IC and a grounding line of the IC.

10. The ESD protection circuit of claim 8 wherein the control module is an inverter.

11. The ESD protection circuit of claim 8 wherein the control module is a NMOS transistor.

12. The ESD protection circuit of claim 8 wherein a thickness of a gate oxide for a regular transistor of the IC is below 60 angstroms.

13. An electro-static discharge (ESD) protection circuit for an integrated circuit (IC) comprising:
    a RC module having a resistor and capacitor connected in series;
    an inverter module with its input coupled to a connection point between the resistor and the capacitor; and
    a current dissipation module for dissipating the ESD having one or more transistors with an output of the inverter controlling gates thereof,
    wherein the capacitor is formed by a thick native gate oxide of a transistor having a threshold voltage close to zero, and
    wherein the thick native gate oxide prevents leakage current formed therethrough so that to avoid leakage current through the current dissipation module during a normal operation of the IC.

14. The ESD protection circuit of claim 13 wherein the current dissipation module has one or more NMOS transistors connected between a pad of the IC and a grounding line of the IC.

15. The ESD protection circuit of claim 13 wherein a thickness of a gate oxide for a regular transistor of the IC is below 60 angstroms.

* * * * *

UNITED STATES PATENT AND TRADEMARK OFFICE
CERTIFICATE OF CORRECTION

PATENT NO. : 7,158,357 B2 Page 1 of 1
APPLICATION NO. : 10/816745
DATED : January 2, 2007
INVENTOR(S) : Chang-fen Hu It is certified that error appears in the above-identified patent and that said Letters Patent is hereby corrected as shown below:

Title page, item (73) Assignee: line 2, delete "Xo." and insert therefore -- Co. --.

Signed and Sealed this

Twenty-fifth Day of December, 2007

JON W. DUDAS
*Director of the United States Patent and Trademark Office*